(12) United States Patent
Zhang et al.

(10) Patent No.: US 7,672,088 B2
(45) Date of Patent: Mar. 2, 2010

(54) HEUSLER ALLOY WITH INSERTION LAYER TO REDUCE THE ORDERING TEMPERATURE FOR CPP, TMR, MRAM, AND OTHER SPINTRONICS APPLICATIONS

(75) Inventors: Kunliang Zhang, Milpitas, CA (US); Min Li, Dublin, CA (US); Yu-Hsia Chen, Mountain View, CA (US); Hui-Chuan Wang, Pleasanton, CA (US); Tong Zhao, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 509 days.

(21) Appl. No.: 11/472,126

(22) Filed: Jun. 21, 2006

(65) Prior Publication Data

US 2007/0297103 A1      Dec. 27, 2007

(51) Int. Cl.
  *G11B 5/39* (2006.01)
(52) U.S. Cl. .................. 360/324.11; 360/324.12; 360/324.2
(58) Field of Classification Search ............ 360/324.11, 360/324.12, 324.2
  See application file for complete search history.

(56) References Cited

U.S. PATENT DOCUMENTS

| | | | | |
|---|---|---|---|---|
| 5,465,185 A | * | 11/1995 | Heim et al. | ............ 360/324.11 |
| 6,205,008 B1 | * | 3/2001 | Gijs et al. | ................... 360/324 |
| 6,756,135 B2 | * | 6/2004 | Hasegawa et al. | ...... 360/324.11 |
| 6,876,522 B2 | | 4/2005 | Ambrose et al. | |
| 6,977,801 B2 | | 12/2005 | Carey et al. | |
| 7,023,670 B2 | | 4/2006 | Saito | |
| 7,038,894 B2 | | 5/2006 | Inomata et al. | |
| 2003/0053270 A1 | * | 3/2003 | Gill | ........................ 360/324.11 |
| 2003/0116426 A1 | | 6/2003 | Kim et al. | |
| 2003/0137785 A1 | | 7/2003 | Saito | |
| 2004/0085681 A1 | * | 5/2004 | Kai et al. | ..................... 360/313 |
| 2004/0165320 A1 | | 8/2004 | Carey et al. | |
| 2005/0201022 A1 | | 9/2005 | Horng et al. | |
| 2006/0007605 A1 | | 1/2006 | Li et al. | |

OTHER PUBLICATIONS

"$Co_2MnSi$ Heusler alloy as magnetic electrodes in magnetic tunnel junctions," by S.Kammerer et al. ,Appl. Phys. Let.,vol. 85, No. 1,Jul. 5, 2004 pp. 79-81.

(Continued)

*Primary Examiner*—Craig A. Renner
(74) *Attorney, Agent, or Firm*—Saile Ackerman LLC; Stephen B. Ackerman

(57) ABSTRACT

A spin valve structure is disclosed in which an AP1 layer and/or free layer are made of a laminated Heusler alloy having Al or FeCo insertion layers. The ordering temperature of a Heusler alloy such as $Co_2MnSi$ is thereby lowered from about 350° C. to 280° C. which becomes practical for spintronics device applications. The insertion layer is 0.5 to 5 Angstroms thick and may also be Sn, Ge, Ga, Sb, or Cr. The AP1 layer or free layer can contain one or two additional FeCo layers to give a configuration represented by FeCo/[HA/IL]$_n$HA, [HA/IL]$_n$HA/FeCo, or FeCo/[HA/IL]$_n$HA/FeCo where n is an integer $\geq 1$, HA is a Heusler alloy layer, and IL is an insertion layer. Optionally, a Heusler alloy insertion scheme is possible by doping Al or FeCo in the HA layer. For example, $Co_2MnSi$ may be co-sputtered with an Al or FeCo target or with a $Co_2MnAl$ or $Co_2FeSi$ target.

12 Claims, 2 Drawing Sheets

OTHER PUBLICATIONS

"Huge Spin-Polarization of L2 1-Ordered $Co_2MnSi$ Epitaxial Heusler Alloy Film", by Y. Sakuraba et al., Japanese Jrnl. of Appl. Phys., vol. 44, No. 35, pp. L1100-L1102 (2005).

"Large tunnel magnetoresistance at room temperature with a $Co_2FeAl$ full-Heusler alloy electrode," by S.Okamura et al., Appl. Phys. Let. 86, 232503 (2005).

"Magnetic tunnel junctions using B2-ordered $Co_2MnAl$ Heusler alloy epitaxial electrode," by Y.Sakuraba et al., Appl. Phys. Let. 88, 022503 (2006).

U.S. Appl. No. 11/180,808, filed Jul. 13, 2005,"CPP Structure with Enhanced GMR Ratio," assigned to the same assignee, Zhang et al.

U.S. Appl. No. 11/352,676, filed Feb. 13, 2006, "Improved Current Confining Layer for GMR Device," assigned to the same assignee, Zhang et al.

* cited by examiner

HEUSLER ALLOY WITH INSERTION LAYER TO REDUCE THE ORDERING TEMPERATURE FOR CPP, TMR, MRAM, AND OTHER SPINTRONICS APPLICATIONS

RELATED PATENT APPLICATIONS

This application is related to the following: Ser. No. 10/796,387, filing date Mar. 9, 2004; Ser. No. 10/886,288, filing date Jul. 7, 2004; Ser. No. 11/180,808, filing date Jul. 13, 2005; and Ser. No. 11/352,676, filing date Feb. 13, 2006, all assigned to a common assignee.

FIELD OF THE INVENTION

The invention relates to Al or FeCo monolayer insertions in a $Co_2MnSi$-like Heusler layer that serves as a free layer or AP1 pinned layer in a giant magnetoresistive (GMR) sensor having a current perpendicular to plane (CPP) configuration, or in a tunneling magnetoresistive (TMR) read head or magnetoresistive random access memory (MRAM) device.

BACKGROUND OF THE INVENTION

A CPP-GMR head is considered as one promising sensor to replace the conventional CIP (current in plane) GMR head for over 100 Gb/in$^2$ recording density. In a typical CPP-GMR sensor, a bottom synthetic spin valve film stack is employed for biasing reasons and a CoFe/NiFe composite free layer is conventionally used following the tradition of CIP-GMR technology. One type of CPP-GMR sensor is called a metallic CPP-GMR that can be represented by the following configuration in which the spacer is a copper layer: Seed/AFM/AP2/Ru/AP1/Cu/free layer/capping layer. GMR spin valve stacks are known to have a configuration in which two ferromagnetic layers are separated by a non-magnetic conductive layer (spacer). One of the ferromagnetic layers is a pinned layer in which the magnetization direction is fixed by exchange coupling with an adjacent anti-ferromagnetic (AFM) or pinning layer. The pinned layer may have a synthetic anti-parallel (SyAP) structure wherein an outer AP2 layer is separated from an inner AP1 layer by a coupling layer such as Ru. The second ferromagnetic layer is a free layer in which the magnetization vector can rotate in response to external magnetic fields. The rotation of magnetization in the free layer relative to the fixed layer magnetization generates a resistance change that is detected as a voltage change when a sense current is passed through the structure. In a CPP configuration, a sense current is passed through the sensor in a direction perpendicular to the layers in the stack. Alternatively, in the CIP sensor, the sense current passes through the sensor in a direction parallel to the planes of the layers in the sensor stack.

Ultra-high density (over 100 Gb/in$^2$) recording requires a highly sensitive read head. To meet this requirement, the CPP configuration is a stronger candidate than the CIP configuration which has been used in recent hard disk drives (HDDs). The CPP configuration is more desirable for ultra-high density applications because a stronger output signal is achieved as the sensor size decreases, and the magnetoresistive (MR) ratio is higher for a CPP configuration. An important characteristic of a GMR head is the MR ratio which is dR/R where dR is the change in resistance of the spin valve sensor and R is the resistance of the spin valve sensor before the change. A higher MR ratio is desired for improved sensitivity in the device and this result is achieved when electrons in the sense current spend more time within the magnetically active layers of the sensor. Interfacial scattering which is the specular reflection of electrons at the interfaces between layers in the sensor stack can improve the MR ratio and increase sensitivity.

Another type of sensor is a so-called confining current path (CCP) CPP GMR sensor where the current through the Cu spacer is limited by the means of segregating metal path and oxide formation. With a current confining (CCP) scheme, CPP GMR performance can be further improved. An example of a CCP CPP-GMR sensor has the following configuration: Seed/AFM/AP2/Ru/AP1/Cu/CCP layer/Cu/free layer/capping layer where the CCP layer is sandwiched between two copper layers.

In a CPP operation mode, a tunnel magnetoresistive (TMR) head is another candidate for realizing high sensitivity. In this design, the non-magnetic conductive layer between the pinned layer and free layer in the GMR stack is replaced by an insulating layer such as $AlO_x$ or MgO. When the magnetoresistive element is a magnetic tunnel junction (MTJ), the tunneling (insulating) layer may be thinned to give a very low RA (<5 ohms-$\mu m^2$).

Heusler alloys such as $Co_2MnX$ (X is Si, Ge, Al, etc.) have attracted much interest due to their large spin polarizations and high Curie temperatures. A very large magnetoresistance (MR) ratio has been observed in TMR multilayer structures with Heusler alloys, especially with $Co_2MnSi$, as indicated in the following four references: S. Kammerer et al, Appl. Phys. Lett. 85 (2004) 79; Y. Sakuraba et al, Japanese Journal of Applied Physics, Vol. 44, No. 35, pp. L1100-L1102 (2005); S. Okamura et al, Applied Phys. Lett., 86 (2005) 232503; and Y. Sakuraba et al, Applied Phys. Lett., 88 (2006) 022503. With this published data, those skilled in the art could easily predict that a large GMR ratio could also be achieved in a CPP-GMR sensor when a $Co_2MnSi$ layer is employed as an AP1 layer or free layer. However, the condition needed to achieve an ordered half metal structure for $Co_2MnSi$ is very difficult and typically requires substrate heating as well as a lengthy high temperature post-annealing treatment. These post-annealing processes generally require a temperature above 350° C. which would destroy the underlying shield structures (in a TMR head) and severely degrade the pinning strength thereby hindering Heusler alloys from practical GMR or TMR sensor applications.

The spin polarization of $Co_2MnSi$ is very sensitive to its site-disordering states due to its unique band structure. Therefore, in order to realize the full potential of the $Co_2MnSi$ spin polarization, it is necessary to remove the site-disorder states and the defects by means of high temperature annealing. For example, the as-deposited single $Co_2MnSi$ layer displays no magnetic moment, no spin polarization, and a very large resistivity which indicates that the film is amorphous. However, after annealing at 350° C. for 5 hours, a magnetic moment begins to appear and the resistivity is reduced considerably, indicating the film is crystalline. It follows that if a $Co_2MnSi$ film were applied directly on top of the bottom shield in a TMR sensor and annealed at high temperature in order to achieve the desired MR ratio, then the bottom shield would be stressed to the point where its domain would enlarge substantially and its surface roughness would increase severely with loss of built-in patterns. These conditions would lead to a very poor spin valve performance. Therefore, a new method is needed to incorporate a Heusler alloy such as $Co_2MnSi$ in a spin valve structure without negatively affecting the underlying substrate or the pinning strength within the sensor.

A CPP-GMR head is generally preferred over a TMR head design for ultra-high density recording because the former has lower impedance. However, the resistance (RA) in a conventional single spin valve is too small (<100 mohm-μm$^2$) and the MR ratio of a CPP head may be very low (<5%). Additionally, the output voltage which is related to the resistance change is unacceptably low for many CPP-GMR configurations. One way to increase the resistance change is to optimize the materials and structure of the CPP-GMR head. In particular, it is desirable to modify the pinned layer and/or free layer to improve performance.

In U.S. Pat. No. 6,876,522, a ferromagnetic Heusler alloy ($Co_2MnSi$ or $Co_2MnGe$) is used in combination with a non-magnetic spacer Heusler alloy such as $Rh_2CuSn$ or $Co_2CuSn$. U.S. Pat. No. 7,023,670 discloses a metalloid ferromagnetic Heusler alloy layer between a non-magnetic material layer and a free magnetic layer and between a pinned magnetic layer and the non-magnetic material layer.

U.S. Patent Application US 2003/0137785 describes a magnetic sensing element in which a portion of the pinned layer adjacent to a non-metallic spacer is comprised of a Heusler alloy sandwiched between two conventional magnetic materials such as CoFe to prevent diffusion of Mn from the Heusler alloy into the non-metallic spacer.

U.S. Pat. No. 6,977,801 and related U.S. Patent Application US 2004/0165320 disclose a tunnel junction wherein a ferromagnetic layer such as FeCo is inserted between an AFM layer and a pinned layer made of a Heusler alloy.

In U.S. Patent Application US 2003/0116426, a method of co-sputtering a Heusler alloy is described in which each of the components is sputtered as a single target.

U.S. Pat. No. 7,038,894 shows a double tunnel junction in which a free layer formed between two insulating layers has a laminated structure comprised of alternating non-magnetic layers (Al or Cr) and Heusler alloy layers that are anti-parallel coupled.

SUMMARY OF THE INVENTION

One objective of the present invention is to reduce the ordering temperature of Heusler alloys such as $Co_2MnSi$ that are used as AP1 and/or free layers in spin valve structures including CPP GMR sensors, TMR heads, and MRAM devices.

A further objective of the present invention is to preserve the large spin polarization in the Heusler alloy in accordance with the first objective so that an acceptable MR ratio and resistance (RA value) are obtained for high recording density (>100 Gbit/in$^2$) applications.

A still further objective is to provide a method for forming a laminated AP1 and/or free layer comprised of a Heusler alloy that satisfies the first two objectives.

These objectives are achieved in one embodiment in which a substrate is provided that may be a first magnetic shield (S1) in a magnetic read head. A sequence of layers is then deposited on the substrate to form a sensor stack with a CPP-GMR configuration that is preferably a bottom spin valve type. In the exemplary embodiment, a metal CPP-GMR sensor is disclosed that is comprised of a stack of layers wherein a seed layer, AFM layer, SyAP pinned layer, Cu spacer, free layer, and capping layer are sequentially formed on the substrate. The SyAP pinned layer has a configuration represented by (AP2/coupling/AP1) wherein the AP2 layer is formed on the AFM layer, the coupling layer is preferably Ru, and the AP1 layer is adjacent to the Cu spacer. A key feature is that the AP1 and/or the free layer are made of a laminated structure represented by [HA/Al]$_n$HA where HA is a Heusler alloy such as $Co_2MnSi$, $Co_2MnGe$, $Co_2MnSn$, $Co_2MnGa$, $Co_2FeAl$, or $Co_2MnAl$, Al is an insertion layer, and n is an integer $\leq 1$. Alternatively, the Al insertion layer may be replaced by $Fe_x$ $Co_{(100-x)}$ where x is from 10 atomic % to 100 atomic % and is preferably >25 atomic %. Still another option is for the Al insertion layer to be substituted by a Sn, Ge, Ga, Sb, or Cr insertion layer. The present invention also encompasses a structure in which the AP1 and/or free layer are a composite layer having a FeCo/[HA/insertion]$_n$HA, [HA/insertion]$_n$HA/FeCo, or FeCo/HA[insertion]$_n$/FeCo configuration wherein the Heusler alloy layers within the [HA/insertion]$_n$HA portion are parallel coupled with each other.

In another embodiment that relates to a CCP CPP GMR sensor, the Cu spacer on the AP1 layer may be advantageously comprised of a middle current confining path (CCP) layer made of oxidized AlCu. In this case, the spacer has a Cu/AlCu/PT/IAO/Cu configuration wherein PT indicates an etching process and IAO is an oxidation process involving RF power used to form the CCP layer. Optionally, a Mg layer may be inserted in the AlCu layer to give a Cu/AlCu/Mg/AlCu/PT/IAO/Cu configuration A third embodiment relates to a TMR sensor. The spin valve structure may be the same as in the first embodiment except that the Cu spacer is replaced by an insulating layer (tunnel barrier) such as $AlO_x$, MgO, or $AlTiO_x$. Optionally, the thickness of the insulating layer and content of the free layer may be modified to satisfy performance requirements for MRAM applications as appreciated by those skilled in the art.

In the exemplary embodiment, the layers in the CPP-GMR spin valve stack are sputter deposited using Ar gas in a sputtering system that is preferably equipped with an ultra-high vacuum. For the CCP CPP-GMR stack, oxide formation and segregated metal path definition in the AlCu CCP layer are achieved by following PT and IAO processes that can be performed in a separate chamber in the sputter system. After the capping layer is deposited on the CPP-GMR spin valve stack, a conventional method involving forming a photoresist mask and reactive ion etching (RIE) is followed to form a CPP-GMR sensor having a top surface with sidewalls. A well known fabrication sequence is then followed that includes forming an insulating layer adjacent to both sidewalls and a second magnetic shield (S2) on the cap layer.

DETAILED DESCRIPTION OF THE INVENTION

The present invention is a spin valve structure having a laminated Heusler alloy as an AP1 and/or free layer and a method for making the same. The spin valve structure may be a metallic CPP-GMR sensor, a CCP CPP-GMR sensor, a TMR sensor, or a magnetic tunnel junction (MTJ) element in a MRAM device. The spin valve structure disclosed herein is especially suited for an ultra-high magnetic recording device wherein the recording density is greater than about 100 Gbits/in$^2$. The drawings are provided by way of example and are not intended to limit the scope of the invention. Although a bottom spin valve structure is shown in the exemplary embodiment, those skilled in the art will appreciate that the laminated Heusler alloy can also be incorporated in a top spin valve or in multilayer spin valves. The Heusler alloy is preferably represented by the formula $A_2MnB$ where A and B are metals or semiconductor elements but a so-called half Heusler alloy (AMnB) may be used instead of the "full" Heusler alloy.

Figure 1:
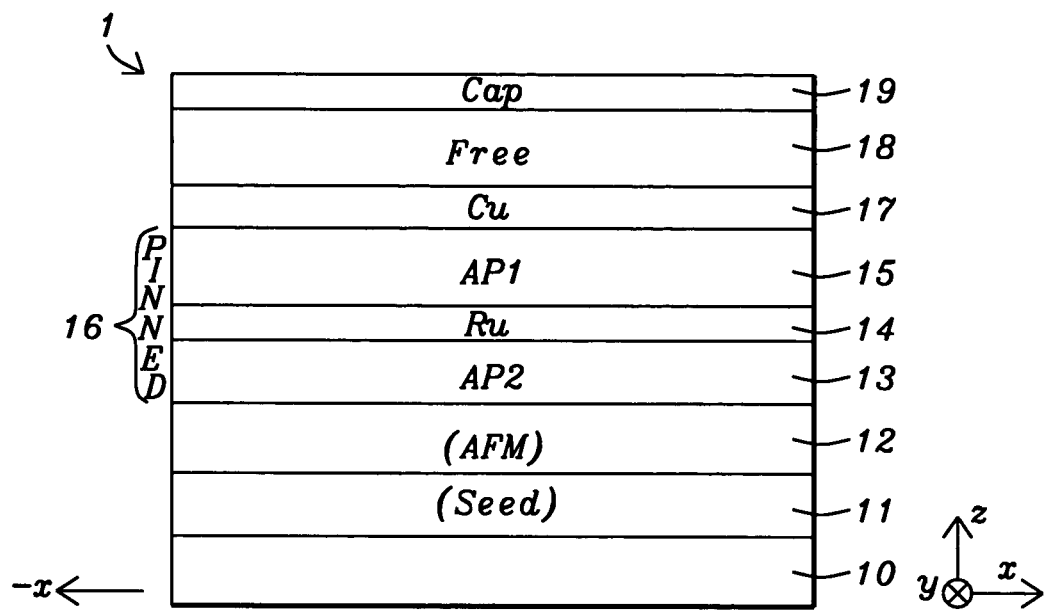
FIG. 1 is a cross-sectional view showing a metal CPP-GMR spin valve structure having a laminated AP1 layer and laminated free layer according to one embodiment of the present invention.

A first embodiment shown in FIG. 1 relates to a metallic CPP-GMR sensor having a bottom spin valve structure. The view in FIG. 1 is from a cross-section along an air bearing surface (ABS) plane in the read head. A novel spin valve structure 1 will be described first and then a method of forming the stack of layers in the spin valve structure will be provided. Referring to FIG. 1, a substrate 10 is shown that is typically a first magnetic shield (S1) in a read head. For example, the substrate 10 may be comprised of a 2 micron thick layer of an electroplated permalloy. There is a seed layer 11 that may be comprised of a lower Ta layer (not shown) having a thickness from 10 to 60 Angstroms and preferably about 20 Angstroms thick, and an upper Ru layer having a thickness about 5 to 40 Angstroms thick and preferably 20 Angstroms thick formed on the substrate 10. The seed layer 11 promotes a smooth and uniform crystal structure in the overlying layers that enhances the MR ratio in the spin valve structure 1.

An AFM layer 12 is formed on the seed layer 11 and is preferably comprised of IrMn having a composition of about 18 to 22 atomic % Ir and a thickness of about 50 to 75 Angstroms. Alternatively, the AFM layer 12 may be made of MnPt having a composition between about 55 to 65 atomic % manganese and with a thickness of about 125 to 175 Angstroms. Those skilled in the art will appreciate that other materials such as NiMn, OsMn, RuMn, RhMn, PdMn, RuRhMn, or PtPdMn may also be employed as the AFM layer 12 which is used to pin the magnetization direction in an overlying ferromagnetic (pinned) layer 16.

In the exemplary embodiment, a synthetic anti-parallel (SyAP) pinned layer 16 is formed on the AFM layer 12 and has an AP2/Ru/AP1 configuration. The AP2 layer 13 is preferably comprised of CoFe with a composition of about 75 to 90 atomic % cobalt and a thickness of about 20 to 50 Angstroms and is formed on the AFM layer 12. The magnetic moment of the AP2 layer 13 is pinned in a direction anti-parallel to the magnetic moment of the AP1 layer. For example, the AP2 layer may have a magnetic moment oriented along the "+x" direction while the AP1 layer has a magnetic moment in the "−x" direction. In a CPP-GMR spin valve, the AP2 layer 13 is generally slightly thicker than the AP1 layer to produce a small net magnetic moment for the pinned layer 16. Exchange coupling between the AP2 layer 13 and the AP1 layer is facilitated by a coupling layer 14 that is preferably comprised of Ru with a thickness of about 7.5 Angstroms. Optionally, Rh or Ir may be employed as the coupling layer 14.

According to the present invention, one or both of the AP1 layer 15 and free layer 18 are made of a laminated Heusler alloy described herein. In one aspect, the AP1 layer 15 may be a conventional ferromagnetic material such as CoFe when the free layer is comprised of a laminated Heusler alloy. However, the inventors have discovered that improved performance is achieved when the AP1 layer is made of a Heusler alloy laminated with insertion layers such as Al or $Fe_xCo_{(100-x)}$ where x is from 10 to 100 atomic % and preferably $\geq 25$ atomic %, and most preferably 70 atomic %. Heusler alloys that may be advantageously used in this invention are $Co_2MnSi$, $Co_2MnGe$, $Co_2MnSn$, $Co_2MnGa$, $Co_2FeAl$, $Co_2MnAl$, and the like. Alternatively, the Al insertion layer may be replaced by a Sn, Ge, Ga, Sb, or Cr insertion layer. In the case of Al, there are three valence electrons ($3s^2$, $3p^1$) and when Al is inserted between two $Co_2MnSi$ layers, it is believed that the hybridization between the Mn "d" electrons and the Al "p" electrons brings a similar effect to that of Mn "d" electrons and Si "p" electrons. Therefore, once the partial substitution of the Al atoms into the Si sites occurs, the half metallicity of the $Co_2MnSi$ layer is preserved. A similar mechanism applies when a FeCo layer is inserted in a $Co_2MnSi$ layer. Since $Co_2MnAl$ and $Co_2FeSi$ are both half metal with the same structure as $Co_2MnSi$, the introduction of hybridization through the use of an insertion layer helps to generate and stabilize the modified half metal structure within those Heusler alloys as well. As a result, the ordering temperature of a Heusler alloy can be reduced significantly from about 350° C. to around 280° C. which is a processing temperature that is compatible with spintronics devices.

In one aspect, the AP1 layer 15 may be represented by a $[HA/IL]_n/HA$ configuration where n is an integer $\geq 1$, HA is a Heusler alloy layer, and IL is an insertion layer. The insertion layer thickness ranges from 0.5 to 5 Angstroms and the Heusler alloy layer thickness is between 10 and 30 Angstroms. Note that each of the HA layers has a magnetic moment (after subsequent annealing) in the "−x" direction when the AP1 layer has a magnetic moment along the "−x" axis. Therefore, the Heusler alloy layers are parallel coupled. Optionally, the AP1 layer may be further comprised of a FeCo layer wherein the Fe content is preferably about 70 atomic %. The FeCo layer with a thickness from 3 to 15 Angstroms may be formed between the Ru coupling layer and $[HA/IL]_nHA$ laminated layers or between the [HA/IL]n/HA laminated layers and the Cu spacer. The present invention also encompasses an embodiment where the AP1 layer has a FeCo layer formed above and below the $[HA/IL]_nHA$ laminated stack to give a. $FeCo/[HA/IL]_nHA/FeCo$ configuration.

A non-magnetic spacer 17 is formed on the SyAP pinned layer 16. When the non-magnetic spacer 17 is made of Cu as in a metallic CPP-GMR sensor, an oxygen surfactant layer (not shown) may be formed on the copper layer according to a method described in Headway patent application HT03-009 which is herein incorporated by reference in its entirety. The oxygen surfactant layer is less than about 1 atomic layer in thickness and is used to improve lattice matching between the copper layer and an overlying magnetic layer which in this case is the free layer 18. In other words, the oxygen surfactant layer relieves stress in the spin valve structure 1 and is also used to grow a smooth overlying magnetic layer. In the exemplary embodiment, the non-magnetic spacer 17 is made of Cu with a thickness of about 20 to 50 Angstroms.

Another key feature of the present invention is the free layer 18 formed on the Cu spacer 17. As mentioned earlier, when the AP1 layer 15 is a conventional ferromagnetic material such as FeCo, then the free layer is comprised of a laminated Heusler alloy having a configuration previously described. However, the present invention also encompasses an embodiment wherein both the AP1 layer 15 and free layer 18 have a laminated Heusler alloy composition as described previously. For example, the free layer 18 may have a configuration represented by $[HA/IL]_nHA$, $FeCo/[HA/IL]_nHA$, $[HA/IL]_nHA/FeCo$, or $FeCo/[HA/IL]_nHA/FeCo$.

The magnetic moment of the free layer 18 is preferably aligned along the y-axis in a quiescent state and can rotate to a magnetic direction along the x-axis under an appropriately sized applied magnetic field such as when the spin valve structure 1 is moved along the ABS plane over a magnetic disk in the z-direction.

The top layer in the spin valve stack is a capping layer 19 that in one embodiment has a Cu/Ru/Ta/Ru configuration in which the Cu layer has a thickness of 10 to 40 Angstroms, the lower Ru layer has a thickness of 10 to 30 Angstroms, the Ta layer is 40 to 80 Angstroms thick, and the upper Ru layer is 10 to 30 Angstroms thick. Optionally, other capping layer materials used in the art may be employed as the capping layer 19.

Figure 3:
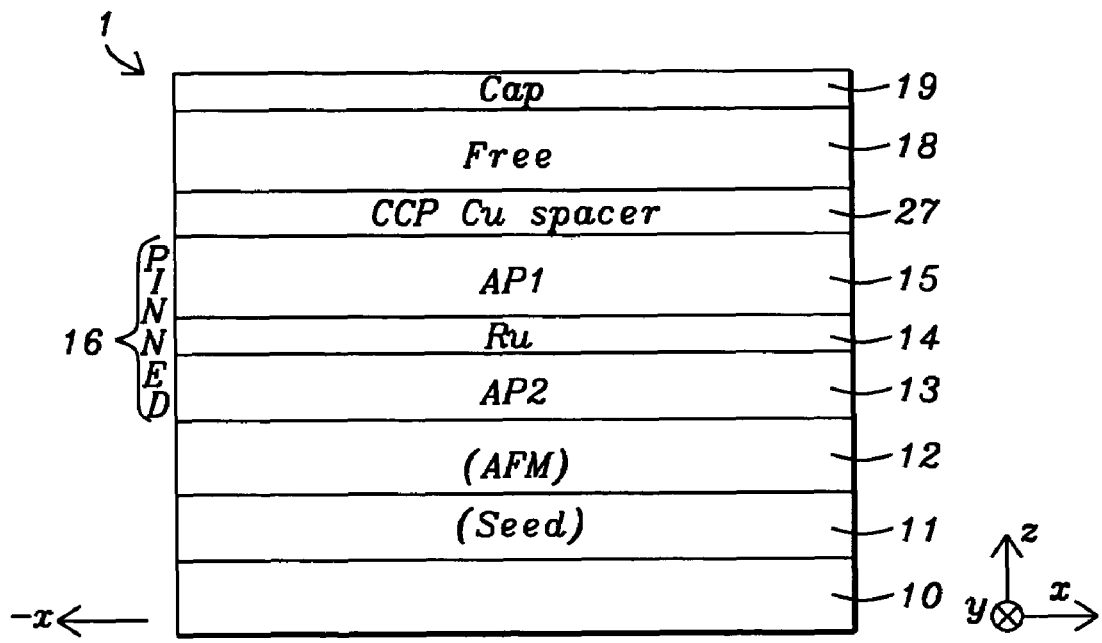
FIG. 3 is a cross-sectional view showing a CCP CPP-GMR spin valve structure having a laminated AP1 layer and laminated free layer according to a second embodiment of the present invention.

In a second embodiment depicted in FIG. 3 that relates to a CCP CPP-GMR sensor, the spin valve structure is similar to that previously described except the spacer 17 is replaced by a composite spacer layer 27 comprised of a confining current path (CCP) layer (not shown) formed between lower and upper copper layers (not shown). As mentioned previously, a CCP layer may be employed in a spin valve structure to improve performance. In one aspect, the lower Cu layer is about 2 to 8 Angstroms thick and preferably 5.2 Angstroms thick, and the upper Cu layer has a thickness between 2 and 6 Angstroms and is preferably 3 Angstroms thick. The CCP layer may be made of AlCu that has been partially oxidized by a process described in a later section. The CCP layer has a thickness from 6 to 10 Angstroms and is preferably a AlCu layer having a thickness of about 8.5 Angstroms and an Al content of about 90 atomic %. The Cu/AlCu/Cu composite spacer layer 27 may be further modified by inserting a Mg layer about 3 to 5 Angstroms thick in the AlCu layer to give a Cu/AlCu/Mg/AlCu/Cu configuration that has been disclosed in a previous Headway patent application HT05-042/053 which is herein incorporated by reference in its entirety. Note that the "outer" AlCu layer that is nearer the free layer 18 is subjected to a PT/IAO process sequence after the AlCu deposition. The PT and IAO processes will be described in a subsequent section.

Figure 4:
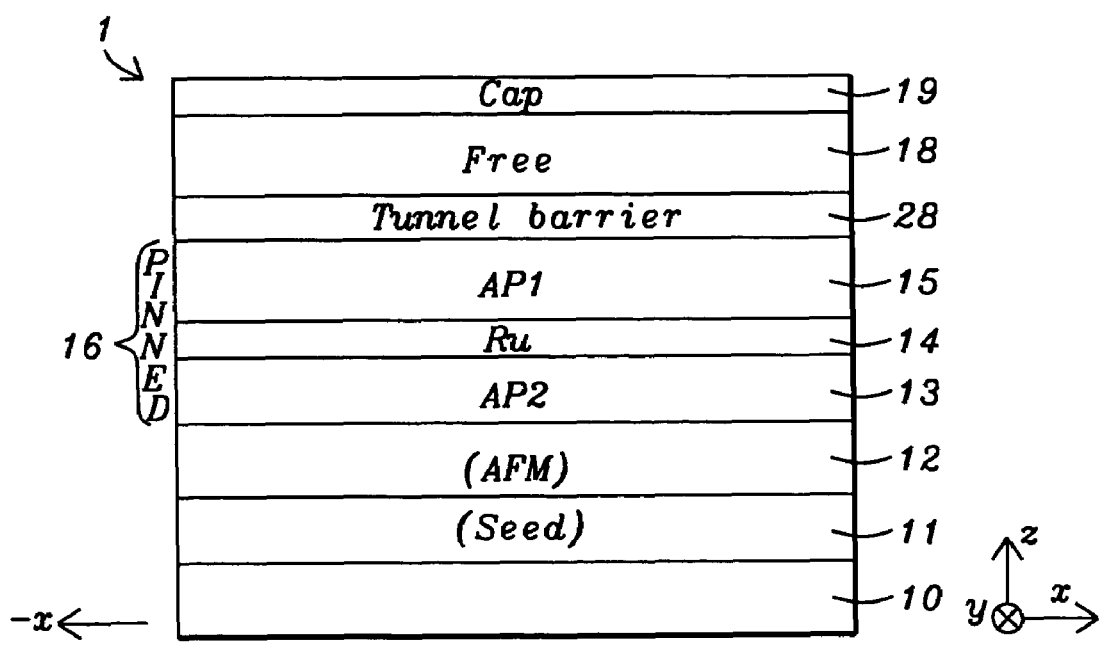
FIG. 4 is a cross-sectional view of a TMR sensor showing a laminated AP1 layer and laminated free layer according to another embodiment of the present invention.

In a third embodiment shown in FIG. 4 that applies to a TMR sensor, the spin valve structure 1 is similar to that described in the first embodiment except the Cu spacer is replaced by a tunnel barrier layer 28 made of AlOx, AlTiOx, TiOx, or MgO. When the tunnel barrier 28 is comprised of AlOx, an Al layer having a thickness of about 4 to 6 Angstroms is deposited on the AP1 layer 15 and is then converted to AlOx by a natural oxidation (NOX) or radical oxidation (ROX) method. Those skilled in the art will appreciate that an AlOx, AlTiOx, TiOx, or MgO tunnel barrier in an MTJ element within an MRAM device has a greater thickness than when employed in a TMR sensor.

Figure 2:
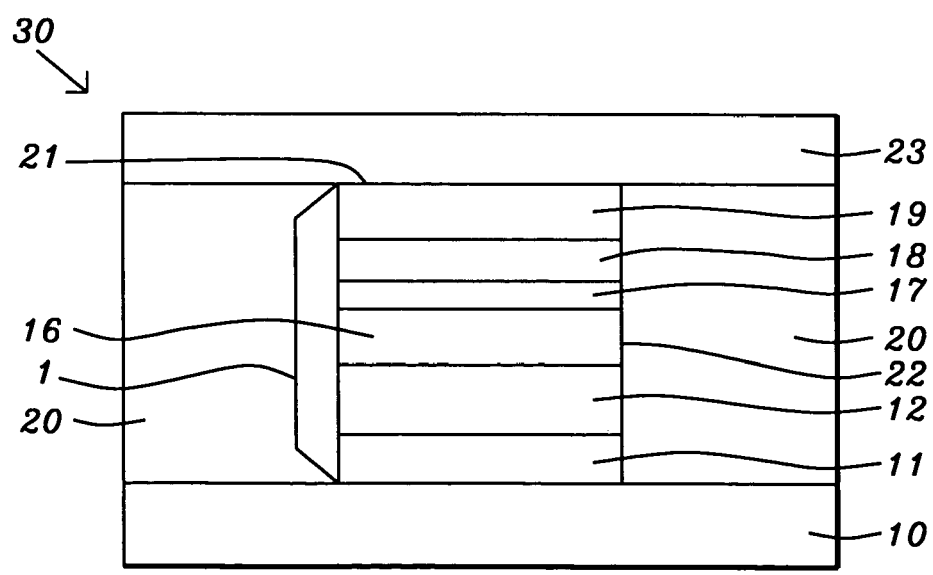
FIG. 2 is a cross-sectional view of a CPP-GMR read head showing the spin valve structure in FIG. 1 formed between a first shield and a second shield.

Referring to FIG. 2, a method of fabricating a magnetic read head 30 that includes the spin valve structure 1 from FIG. 1 will now be described. A substrate 10 is provided as mentioned previously and may be a first magnetic shield (S1) formed by a conventional method in the read head 30. The spin valve stack described previously is laid down by a process in which the seed layer 11, AFM layer 12, pinned layer 16, Cu spacer 17 free layer 18, and capping layer 19 are sequentially formed on the substrate 10. A DC magnetron sputter system such as one available from Anelva may be employed that is capable of a base pressure of at least $1 \times 10^{-8}$ torr and preferably less than $5 \times 10^{-9}$ torr, and has five sputter deposition chambers. A lower base pressure allows films to be sputter deposited with higher uniformity and reproducibility. It should be understood that a sputter chamber may have multiple targets which are low pressure discharge cathodes. At least one sputter chamber should be capable of co-sputtering using two targets. The sputter gas is preferably Ar. All of the sputter deposited films may be laid down in the same sputter chamber or in different sputter chambers within the same mainframe.

In an alternative embodiment, the process of sequentially laying down the laminated Heusler layer [HA/IL]$_n$HA by depositing HA and then IL "n" number of times followed by a final HA layer may be replaced by a co-sputtering method for performing an Al or FeCo insertion scheme. For example, the $Co_2MnSi$ target may be doped with a small amount of Al or Fe atoms wherein the composition of the doped target has a concentration of about 2.5 to 12.5 atomic % Al or Fe. Alternatively, Al or Fe insertion in a Heusler alloy may be accomplished by co-sputtering of $Co_2MnSi$ with an Al or FeCo target, for example, or by co-sputtering $Co_2MnSi$ with a $Co_2MnAl$ or $Co_2FeSi$ target. It should be understood by those skilled in the art that a different forward power may be applied to one target compared with a second target during a co-sputtering process in order to compensate for different deposition rates from the two targets. Thus, the AP1 layer and/or free layer may be comprised of a Heusler alloy made of $Co_2MnSi$ and an Al or Fe dopant in the Heusler alloy.

In an embodiment (FIG. 3) relating to a CCP CPP-GMR sensor, the composite spacer 27 may be comprised of a lower Cu layer, a CCP layer, and an upper Cu layer. The CCP layer may be formed by depositing an AlCu layer about 6 to 10 Angstroms thick on the lower Cu layer followed in succession by a RF (plasma or ion treatment) PT process and a RF-IAO process, hereafter referred to as PT and IAO processes, to form a partially oxidized AlCu layer. The PT and IAO (plasma oxidation or ion assisted oxidation) processes are preferably performed in a separate chamber within the sputter system and have been previously described in Headway application HT03-043 which is herein incorporated by reference in its entirety. The PT process preferably involves a low power plasma etch to remove about 1 to 3 Angstroms of the AlCu layer and may comprise the following conditions: an Ar flow rate of about 50 sccm and a RF power level of 17 to 20 Watts for about 20 to 60 seconds. During the IAO process, the AlCu layer is subjected to plasma oxidation which converts the AlCu layer into CCP layer that is essentially a porous aluminum oxide layer whose pores are filled with Cu. The IAO process may comprise the following conditions: an Ar flow rate of about 30-50 sccm, an $O_2$ flow rate of 0.3 to 1 sccm, and a RF power level of 20 to 30 W for about 15 to 45 seconds. Subsequently, the upper Cu layer is sputter deposited on the CCP layer followed by the sequential deposition of the free layer 18 and cap layer 19 on the upper Cu layer.

In an alternative embodiment wherein the composite spacer 27 is comprised of a lower Cu layer, a first AlCu layer, a Mg layer, a second AlCu (CCP) layer, and an upper Cu layer, only the second AlCu layer is treated with the PT and IAO processes.

Optionally, for a read head 30 that is based on TMR spin valve structure 1 as depicted in FIG. 4, the Cu spacer 17 (FIG. 1) may be replaced by a non-magnetic spacer (tunnel barrier) 28 that is prepared by first depositing an Al layer or the like about 5 to 6 Angstroms thick on the pinned layer 16 and then oxidizing with a natural oxidation or radical oxidation to form an oxide layer such as AlOx which has a stoichiometry close to that of $Al_2O_3$. According to another embodiment, a Mg or Ti layer may be deposited on the AP1 layer and oxidized to form MgO or TiOx, respectively, or AlTi is deposited on the AP1 layer and oxidized to form AlTiOx as the tunnel barrier 28.

Returning to FIG. 2, after all of the layers in the spin valve stack 1 are laid down on the substrate 10, the spin valve stack is patterned and etched by a well known process that involves patterning a photoresist layer (not shown) on the top surface 21 and a reactive ion etch (RIE) method, for example, to remove portions of the stack that are not protected by the photoresist mask. Following the etch step, a spin valve structure having a top surface 21 and sidewalls 22 is defined. An insulating layer 20 is typically deposited to a depth that covers the sidewalls 22. There may also be a biasing layer (not shown) that is formed within the insulating layer 20 proximate to each side of the spin valve structure to provide longitudinal biasing to the free layer as appreciated by those skilled in the art. Thereafter, the photoresist layer is removed by a lift-off process and the insulating layer 20 may be smoothed by a planarization technique such as a chemical mechanical polish (CMP) method to become coplanar with the top surface 21.

The spin valve structure 1 may be annealed in a magnetic field of about 8000 and 12000 oersted at a temperature between about 250° C. and 300° C. for a period of 2 to 5 hours. The remainder of the read head 30 may then be fabricated by a conventional process. For example, a second magnetic shield 23 may be formed on the top surface 21 and over the insulating layer 20. Those skilled in the art will appreciate that in a CPP spin valve structure, the second magnetic shield layer (S2) is also used as the top conductor lead layer.

Table 1 summarizes the effect of Al or FeCo insertion layers within $Co_2MnSi$ AP1 and free layers in metallic CPP-GMR and CCP CPP-GMR sensors. The spin valve structures (Wafer #1-3) differ only in the composition of the AP1 layer and free layer while Wafer #4 has an additional change through incorporation of a CCP layer in the Cu spacer. MR ratio (dR/R) and resistance (RA value) are listed for an unpatterned sensor stack (Wafer #1) previously fabricated by the inventors and for unpatterned stacks on Wafers #2-4 formed according to the present invention.

fabrication. Without the preferred Al or FeCo insertions in the CCP CPP-GMR stack (Wafer #4), the annealing temperature would typically be 350° C. or above for the $Co_2MnSi$ half metal phase formation due to the amorphous spacer generated by the PT and IAO treatments of the AlCu layer during the CCP process.

Note that the numbers (excluding subscripts) in Table 1 refer to thickness in Angstroms for the seed layer (Ta10/Ru10), AFM layer (IrMn70), AP2 layer [$Fe_{10}Co_{90}$8/$Fe_{70}Co_{30}$12/$Fe_{10}Co_{90}$20], coupling layer (Ru7.5), copper spacer (Cu40), and capping layer (Cu10/Ru10/Ta60/Ru30). The notation for the spacer in Wafer #4 means that the lower Cu layer is 5.2 Angstroms thick, the middle CCP layer is an 8.7 Angstrom thick (as deposited) Al/Cu layer that was treated by PT and IAO processes, and the upper Cu layer is 3 Angstroms thick.

The advantages of the present invention are that spin valve structures incorporating Heusler alloys in AP1 and/or free layers are made practical for use in spintronics devices because the ordering temperature is reduced due to the presence of insertion layers such as Al or FeCo in the Heusler alloys. Moreover, a dR/R of about 5% or higher can be achieved with a reasonable RA value with the insertion scheme. The laminated Heusler alloys containing insertion layers may be readily prepared using existing manufacturing tools and processes.

While this invention has been particularly shown and described with reference to, the preferred embodiment thereof, it will be understood by those skilled in the art that various changes in form and details may be made without departing from the spirit and scope of this invention.

We claim:

1. A spin valve structure in a spintronics device comprising a free layer, a synthetic anti-parallel (SyAP) pinned layer

TABLE 1

Effect of thin Al or FeCo insertions on metallic and CCP CPP heads with Co2MnSi as AP1 and/or free layer

| Wafer ID | Spin Valve Configuration | Anneal temp. | dR/R | RA |
|---|---|---|---|---|
| #1 | Ta10Ru10/IrMn70/$Fe_{10}Co_{90}$8/$Fe_{70}Co_{30}$12/ $Fe_{10}Co_{90}$20/Ru7.5/$Fe_{70}Co_{30}$12/$Co_2MnSi$40/ Cu40/$Co_2MnSi$80/Cu10/Ru10/Ta60/Ru30 | 330° C. | 6.2% | 0.060 |
| #2 | AP1 = $Fe_{70}Co_{30}$12/[$Co_2MnSi$13Al2] × 2/$Co_2MnSi$14 Spacer = Cu40 Free layer = [$Co_2MnSi$20/Al2] × 4 | 280° C. | 4.6% | 0.061 |
| #3 | AP1 = $Fe_{70}Co_{30}$12/[$Co_2MnSi$13FeCo2] × 2/$Co_2MnSi$14 Spacer = Cu40 Free layer = [$Co_2MnSi$20/FeCo2] × 4 | 280° C. | 5.2% | 0.063 |
| #4 | AP1 = $Fe_{70}Co_{30}$10/ [$Co_2MnSi$12Al2] × 2/$Co_2MnSi$12/$Fe_{25}Co_{75}$12 Spacer = Cu5.2/AlCu8.7PT35/IAO40/Cu3 Free layer = FeCo12[$Co_2MnSi$20/Al2] × 2/$Co_2MnSi$20 | 280° C. | 11.8% | 0.34 |

It is important to note that the magnetic properties for the stack on wafer #1 are achieved only after annealing at 330° C. due to the high ordering temperature of the $Fe_{70}Co_{30}$/$Co_2MnSi$ AP1 layer and $Co_2MnSi$ free layer. Below 330° C., the dR/R ratio vanishes. This temperature is too high to be compatible with typical CPP-GMR sensors because it causes a loss of pinning strength in the device and degrades the shield properties. The ordering temperature is reduced to 280° C. or below for Wafer #2-4 because of the preferred laminated Heusler alloys with Al or FeCo insertion layers in the AP1 and free layers. It is well known that an annealing temperature in the 250° C. to 280° C. range is practical for current head having an inner AP1 layer that is anti-parallel pinned with an outer AP2 layer through a coupling layer in an AP2/coupling/AP1 configuration, and a spacer or tunnel barrier layer formed between the AP1 layer and free layer wherein one or both of said AP1 layer and free layer are comprised of a laminated Heusler alloy with a configuration represented by [HA/IL]$_n$HA where n is an integer $\geq 1$ HA is a Heusler alloy layer, and IL is a metal insertion layer comprised of Al, Sn, Ga, Sb, Cr, or $Fe_xCo_{(100-x)}$ wherein x is from 10 to 100 atomic %.

2. The spin valve structure of claim 1 wherein the spintronics device is a metallic CPP-GMR sensor having a Cu spacer, a CCP CPP-GMR sensor with a Cu/CCP layer/Cu spacer, or a magnetic tunnel junction in a TMR sensor or MRAM device having a tunnel barrier layer.

3. The spin valve structure of claim 1 wherein the Heusler alloy is comprised of $Co_2MnSi$, $Co_2MnGe$, $Co_2MnSn$, $Co_2MnGa$, $Co_2FeAl$, or $Co_2MnAl$ and has a thickness from about 10 to 30 Angstroms.

4. The spin valve structure of claim 1 wherein the insertion layer has a thickness between about 0.5 and 5 Angstroms.

5. The spin valve structure of claim 1 further comprised of one or two FeCo layers formed adjacent to the laminated Heusler alloy such that the AP1 layer and/or free layer has a configuration represented by $FeCo/[HA/IL]_nHA$, $[HA/IL]_nHA/FeCo$, or $FeCo/[HA/IL]_nHA/FeCo$.

6. A spin valve structure in a spintronics device comprising a free layer, a synthetic anti-parallel (SyAP) pinned layer having an inner AP1 layer that is anti-parallel pinned with an outer AP2 layer through a coupling layer in an AP2/coupling/AP1 configuration, and a spacer or tunnel barrier layer formed between the AP1 layer and free layer wherein one or both of said AP1 layer and free layer are comprised of a Heusler alloy made of $Co_2MnSi$ and an Al or Fe dopant in the Heusler alloy.

7. A ferromagnetic layer within a spin valve structure comprised of a laminated Heusler alloy having a configuration represented by $[HA/IL]_nHA$, $FeCo/[HA/IL]_nHA$, $[HA/IL]_nHA/FeCo$, or $FeCo/[HA/IL]_nHA/FeCo$ where n is an integer $\geq 1$, HA is a Heusler alloy layer, IL is a metal insertion layer comprised of Al, Sn, Ga, Sb, Cr, or $Fe_xCo_{(100-x)}$ wherein x is from 10 to 100 atomic %, and said Heusler alloy layers are parallel coupled.

8. The ferromagnetic layer of claim 7 wherein said ferromagnetic layer is an AP1 layer in a SyAP pinned layer or a free layer.

9. The ferromagnetic layer of claim 7 wherein the Heusler alloy layer is comprised of $Co_2MnSi$, $Co_2MnGe$, $Co_2MnSn$, $Co_2MnGa$, $Co_2FeAl$, or $Co_2MnAl$.

10. A ferromagnetic layer within a spin valve structure comprised of a laminated Heusler alloy having a configuration represented by $FeCo/[HA/IL]_nHA$, $[HA/IL]_nHA/FeCo$, or $FeCo/[HA/IL]_nHA/FeCo$ where n is an integer $\geq 1$, HA is a Heusler alloy layer, IL is an insertion layer, and said Heusler alloy layers are parallel coupled.

11. The ferromagnetic layer of claim 10 wherein the Heusler alloy layer is comprised of $Co_2MnSi$, $Co_2MnGe$, $Co_2MnSn$, $Co_2MnGa$, $Co_2FeAl$, or $Co_2MnAl$ and has a thickness from about 10 to 30 Angstroms.

12. The ferromagnetic layer of claim 10 wherein the insertion layer is comprised of Al, Sn, Ge, Ga, Sb, Cr, or $Fe_xCo_{(100-x)}$ wherein x is from 10 to 100 atomic % and said insertion layer has a thickness between about 0.5 and 5 Angstroms.

* * * * *